(12) United States Patent
Seyama et al.

(10) Patent No.: US 12,131,921 B2
(45) Date of Patent: Oct. 29, 2024

(54) MANUFACTURING APPARATUS OF SEMICONDUCTOR DEVICE

(71) Applicant: SHINKAWA LTD., Tokyo (JP)

(72) Inventors: Kohei Seyama, Tokyo (JP); Takahiro Shimizu, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 21 days.

(21) Appl. No.: 18/012,944

(22) PCT Filed: Dec. 13, 2021

(86) PCT No.: PCT/JP2021/045830
§ 371 (c)(1),
(2) Date: Dec. 26, 2022

(87) PCT Pub. No.: WO2022/158166
PCT Pub. Date: Jul. 28, 2022

(65) Prior Publication Data
US 2023/0352324 A1 Nov. 2, 2023

(30) Foreign Application Priority Data
Jan. 19, 2021 (WO) .................. PCT/JP2021/001678

(51) Int. Cl.
*B32B 43/00* (2006.01)
*B32B 41/00* (2006.01)
(Continued)

(52) U.S. Cl.
CPC ........ *H01L 21/67132* (2013.01); *B32B 41/00* (2013.01); *B32B 43/006* (2013.01);
(Continued)

(58) Field of Classification Search
CPC ............ B32B 43/006; Y10T 156/1132; Y10T 156/1158; Y10T 156/1917; Y10T 156/1944
See application file for complete search history.

(56) References Cited

U.S. PATENT DOCUMENTS 7,641,760 B2  1/2010  Doi et al.
2015/0279718 A1*  10/2015  Brun ................. H01L 21/67028
156/707
(Continued)

FOREIGN PATENT DOCUMENTS

JP  H0272638  3/1990
JP  2006160935  6/2006
(Continued)

OTHER PUBLICATIONS

"International Search Report (Form PCT/ISA/210) of PCT/JP2021/045830," mailed on Feb. 1, 2022, with English translation thereof, pp. 1-4.

*Primary Examiner* — Philip C Tucker
*Assistant Examiner* — Nickolas R Harm
(74) *Attorney, Agent, or Firm* — JCIPRNET

(57) ABSTRACT

A manufacturing apparatus (10) for manufacturing a semiconductor device includes: a wafer holding device (12), a PU device (14) having a PU head (40) that holds a target chip (100) in a non-contact manner, an energy irradiation device (16) irradiating energy to the target chip (100) from a back surface side of a dicing tape (130) to reduce an adhesive force of the dicing tape (130), and a controller (22). An adhesive layer of the dicing tape (130) is a self-peeling adhesive layer having an adhesive force that decreases with irradiation of the energy and floats the target chip (100) by a small distance. The controller (22) controls a position of the PU head (40) so that the target chip (100) and the PU
(Continued)

head (40) do not come into contact with each other even if the target chip (100) floats during a takeoff preparation period.

16 Claims, 13 Drawing Sheets

(51) Int. Cl.
  *H01L 21/67* (2006.01)
  *H01L 21/683* (2006.01)
(52) U.S. Cl.
  CPC .... *H01L 21/6838* (2013.01); *B32B 2310/028* (2013.01); *B32B 2310/0831* (2013.01); *B32B 2457/14* (2013.01); *Y10T 156/1132* (2015.01); *Y10T 156/1158* (2015.01); *Y10T 156/1917* (2015.01); *Y10T 156/1944* (2015.01)

(56) References Cited

U.S. PATENT DOCUMENTS

| | | |
|---|---|---|
| 2016/0049325 A1* | 2/2016 | Paramio Joves ... B32B 37/0046 156/247 |
| 2022/0216078 A1 | 7/2022 | Seyama et al. |
| 2022/0216089 A1 | 7/2022 | Li et al. |

FOREIGN PATENT DOCUMENTS

| | | |
|---|---|---|
| JP | 2007194433 | 8/2007 |
| JP | 2008130742 | 6/2008 |
| WO | 2018061107 | 4/2018 |
| WO | 2020213566 | 10/2020 |
| WO | 2020213567 | 10/2020 |

* cited by examiner

MANUFACTURING APPARATUS OF SEMICONDUCTOR DEVICE

CROSS-REFERENCE TO RELATED APPLICATION

This application is a 371 application of the International PCT application serial no. PCT/JP2021/045830, filed on Dec. 13, 2021, which claims the priority benefits of International PCT application serial no. PCT/JP2021/001678, filed on Jan. 19, 2021. The entirety of each of the above-mentioned patent applications is hereby incorporated by reference herein and made a part of this specification.

TECHNICAL FIELD

The present specification discloses a manufacturing apparatus for manufacturing a semiconductor device by bonding a chip to a substrate.

RELATED ART

In flip-chip mounting, a chip is bonded to a bonding target by pressing a bonding surface of the chip against the bonding target which is a substrate or another chip. In this case, the bonding quality of the chip to the bonding target largely depends on the quality of the bonding surface. In particular, when performing room-temperature bonding which bonds the chip to the bonding target at room temperature by using atomic bonding or molecular bonding, the bonding surface of the chip is required to maintain high quality.

CITATION LIST

Patent Literature

[Patent Literature 1] Japanese Patent Laid-Open No. 2008-130742

SUMMARY OF INVENTION

Technical Problem

However, conventionally, the quality of the bonding surface may deteriorate in the process of picking up the chip. That is, normally, the chip before bonding is adhesively held on a dicing tape in a posture with the bonding surface facing upward. The conventional pickup device sucks and holds the chip in order to pick up the chip from the dicing tape, and mechanically contacts the bonding surface of the chip in the process of pickup. Due to such mechanical contact, the bonding surface of the chip may be mechanically or chemically changed, and the bonding quality with the bonding target may deteriorate.

In addition, Patent Literature 1 discloses a method that includes a dicing process of attaching a dicing tape whose adhesive force is reduced by giving a stimulus to a wafer and then dicing the wafer into individual chips, an adhesive force reduction process of giving a stimulus to the dicing tape to reduce the adhesive force, and a pickup process of picking up the chip by sucking the chip with a suction nozzle. According to such a technique, since the adhesive force of the dicing tape is reduced before pickup, the chip can be picked up by a small force.

However, even in the technique of Patent Literature 1, the suction nozzle mechanically contacts the bonding surface of the chip during pickup. For this reason, degeneration of the bonding surface cannot be prevented, and deterioration of the bonding quality of the chip to the target cannot be prevented.

Therefore, in the present specification, a manufacturing apparatus of a semiconductor device, which is capable of further improving the bonding quality of the chip to the target, is disclosed.

Solution to Problem

A manufacturing apparatus of a semiconductor device disclosed in the present specification is a manufacturing apparatus for manufacturing a semiconductor device by bonding a chip, which has a bonding surface and a holding surface opposite to the bonding surface, to a bonding target. The manufacturing apparatus includes: a wafer holding device holding one or more chips with the holding surface adhesively held on a surface of a dicing tape together with the dicing tape; a pickup device comprising a pickup head that holds a target chip, which is a chip to be picked up among the one or more chips, in a non-contact manner and picking up the target chip from the dicing tape; an energy irradiation device irradiating energy, which is light or heat, in an area-selective manner toward the target chip from a back surface side of the dicing tape to reduce an adhesive force of the dicing tape; and a controller controlling an operation of the pickup device and the energy irradiation device. An adhesive layer of the dicing tape is a self-peeling adhesive layer having an adhesive force that decreases with irradiation of the energy and floats the target chip by a small distance, and the controller controls a position of the pickup head so that the target chip and the pickup head do not come into contact with each other even if the target chip floats during a takeoff preparation period from bringing the pickup head close to the target chip for pickup to taking off the target chip from the dicing tape.

In this case, the controller may keep an inter-surface distance, which is a distance between a suction surface of the pickup head and the bonding surface of the target chip, constant by raising the pickup head to offset floating of the target chip during the takeoff preparation period.

Further, the pickup head may attract the target chip to the suction surface when the inter-surface distance is smaller than a maximum effective distance and larger than a neutral distance, and press the target chip in a direction away from the suction surface when the inter-surface distance is smaller than the neutral distance, and the controller may keep the inter-surface distance constant at a distance smaller than the neutral distance during the takeoff preparation period.

Further, the controller may perform position-load control on the pickup head to keep a load acting on the pickup device constant during the takeoff preparation period.

In addition, the controller may store a target profile showing a time change of a target position of the pickup head for keeping the inter-surface distance constant during the takeoff preparation period, and control the position of the pickup head according to the target profile in the takeoff preparation period.

Further, the controller may cause the pickup head to stand by at a standby height during the takeoff preparation period, and the standby height may be a height for holding the target chip without the pickup head coming into contact with the target chip when the target chip completely floats.

In this case, the pickup head may attract the target chip to a suction surface when an inter-surface distance, which is a distance between the suction surface of the pickup head and the bonding surface of the target chip, is smaller than a maximum effective distance and larger than a neutral distance, and press the target chip in a direction away from the suction surface when the inter-surface distance is smaller than the neutral distance, and the standby height may be a height at which the inter-surface distance becomes smaller than the maximum effective distance and larger than the neutral distance at a timing before the target chip starts to float.

Further, the pickup head may eject air from the suction surface or apply ultrasonic vibration to the suction surface to form an air layer between the pickup head and a suction target and hold the suction target in a non-contact manner, and the controller may start ejection of the air or application of the ultrasonic vibration at the same time as start of irradiation of the energy performed by the energy irradiation device or before start of irradiation.

Another manufacturing apparatus of a semiconductor device disclosed in the present specification is a manufacturing apparatus for manufacturing a semiconductor device by bonding a chip, which has a bonding surface and a holding surface opposite to the bonding surface, to a bonding target. The manufacturing apparatus includes: a wafer holding device holding one or more chips with the holding surface adhesively held on a surface of a dicing tape together with the dicing tape; a pickup device arranged to face the bonding surface of the chip and holding and picking up a target chip, which is a chip to be picked up among the one or more chips, in a non-contact manner; an energy irradiation device irradiating energy, which is light or heat, in an area-selective manner toward the target chip from a back surface side of the dicing tape to reduce an adhesive force of the dicing tape; and a controller controlling an operation of the pickup device and the energy irradiation device.

In this case, an adhesive layer of the dicing tape may be a UV self-peeling adhesive layer having an adhesive force that decreases with irradiation of ultraviolet rays and generating gas. The energy irradiation device may irradiate ultraviolet rays as the energy, and the pickup device may have an air ejection type non-contact chuck that ejects air from the center of the suction surface thereof and forms an air layer between the non-contact chuck and the suction target while generating a vacuum suction force in the center, thereby holding the suction target in a non-contact manner.

In this case, the controller may start irradiation of the ultraviolet rays performed by the energy irradiation device after or at the same time as the start of ejection of the air performed by the pickup device.

Further, the controller may control the energy irradiation device so that an irradiation area of the energy is an area that expands outward with respect to an outer shape of the target chip.

In addition, a detector may be further provided for detecting a reaction force that the pickup device receives from the target chip, and the controller may determine a timing at which the target chip is peeled off from the dicing tape based on a change of a load detected by the detector.

Further, the controller may be configured to execute a pre-irradiation process of causing the energy irradiation device to irradiate the energy in an amount at which a residual adhesive force remains before the pickup device starts sucking the target chip, and a main irradiation process of causing the energy irradiation device to irradiate the energy in an amount at which the remaining adhesive force disappears after the pre-irradiation process.

Furthermore, the adhesive layer of the dicing tape may have an adhesive force that decreases with irradiation of heat. The energy irradiation device may irradiate heat as the energy, and the pickup device may have an air ejection type non-contact chuck that ejects air radially outward from the center of the suction surface thereof and forms an air layer between the non-contact chuck and the suction target while generating a vacuum suction force in the center, thereby holding the suction target in a non-contact manner. The controller may start ejection of the air performed by the pickup device after causing the energy irradiation device to irradiate the energy in an amount at which the adhesive force disappears.

Effects of Invention

In the manufacturing apparatus of the semiconductor device disclosed in the present specification, the adhesive force of the dicing tape is locally eliminated. Therefore, the target chip can be picked up even by a non-contact pickup device that has a small suction force. Then, as a result, it is possible to effectively prevent the quality of the bonding surface of the target chip from deteriorating, and it is possible to further improve the bonding quality of the chip to the target.

DESCRIPTION OF EMBODIMENTS

Figure 1:
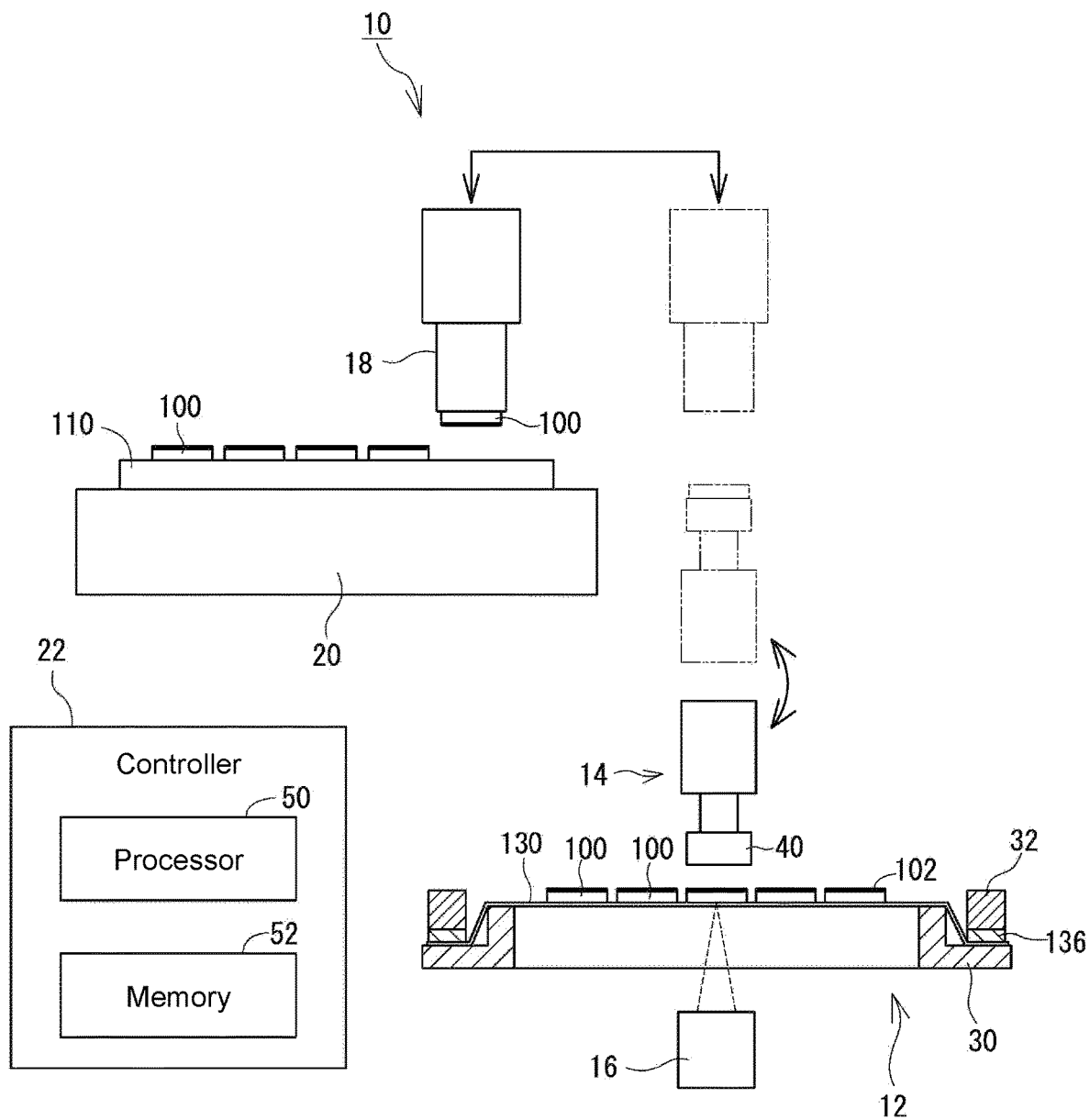
FIG. 1 is a diagram showing a configuration of the manufacturing apparatus.

Hereinafter, a configuration of a manufacturing apparatus 10 of a semiconductor device will be described with reference to the drawings. FIG. 1 is a diagram showing the configuration of the manufacturing apparatus 10. The manufacturing apparatus 10 picks up a chip 100 from a dicing tape 130, bonds the chip 100 to a bonding target which is a substrate 110 or another chip 100, and manufactures the semiconductor device. The chip 100 is provided with a bonding material on one surface thereof, and is bonded to the bonding target by pressing the one surface against the bonding target. In the following, the surface of the chip 100 on which the bonding material is formed is referred to as a "bonding surface 102," and the surface on the opposite side thereof is referred to as a "holding surface." Further, in the following drawings, the bonding surface 102 is shown by a thick line.

When the chip 100 is bonded to the bonding target, the chip 100 may be heated to melt the bonding material, but in this example, the chip 100 is bonded to the bonding target at room temperature without heating. Such room-temperature bonding is bonding using atomic bonding or molecular bonding. In order to perform room-temperature bonding, the bonding surface 102 of the chip 100 of this example is required to maintain high quality.

In order to bond the chip 100 to the bonding target, the manufacturing apparatus 10 has a mounting head 18 and a stage 20. The stage 20 is a table on which the substrate 110 is placed. The mounting head 18 is arranged to face the stage 20 and sucks and holds the holding surface of the chip 100 at an end thereof. In other words, the mounting head 18 holds the chip 100 so that the bonding surface 102 of the chip 100 faces the stage 20. The mounting head 18 moves relative to the stage 20, so that the chip 100 is pressed against the bonding target.

In order to supply the chip 100 to the mounting head 18, the manufacturing apparatus 10 is further provided with a wafer holding device 12, a pickup device (hereinafter referred to as "PU device") 14, and an energy irradiation device 16. The wafer holding device 12 holds the wafer together with a dicing tape 130. The wafer has the dicing tape 130 attached in advance, and then is diced and divided into individual chips 100. Therefore, a plurality of chips 100 are lined up on the surface of the dicing tape 130. As will be described in detail later, the dicing tape 130 has a base material 132 and an adhesive layer 134, and holds the individual chips 100 by the adhesive force of the adhesive layer 134. A wafer ring 136 is attached to the dicing tape 130 so as to surround the wafer. The plurality of chips 100 are held by the dicing tape 130 in a posture in which the holding surface is in contact with the adhesive layer 134 and the bonding surface 102 faces upward (so-called face-up posture).

The wafer holding device 12 holds the dicing tape 130 in a state of applying tension on the outside in the surface direction, and has an expanding ring 30 and a ring retainer 32. The expanding ring 30 is a substantially cylindrical member having a through hole penetrating in the axial direction, and is provided with a flange extending outward in the radial direction at the lower end thereof. The inner diameter of the expanding ring 30 is larger than the diameter of the wafer and smaller than the inner diameter of the wafer ring 136.

The dicing tape 130 is placed on the expanding ring 30. Further, the wafer ring 136 attached to the dicing tape 130 is pressed and fixed to the flange of the expanding ring 30 by the ring retainer 32. At this time, the dicing tape 130 is in a state of covering the upper end of the through hole of the expanding ring 30, and the dicing tape 130 can be accessed from below via the through hole.

The PU device 14 picks up the chip 100 from the dicing tape 130 in a face-up state, changes the chip 100 to a face-down posture, and directly or indirectly delivers the chip 100 to the mounting head 18. As shown in FIG. 1, the PU device 14 has a PU head 40 that is arranged to face the bonding surface 102 of the chip 100 and holds the bonding surface 102 of the chip 100 to be picked up (hereinafter referred to as "target chip 100"). After picking up the target chip 100, the PU head 40 rotates 180 degrees to change the target chip 100 to the face-down posture. The PU device 14 delivers the target chip 100 in this face-down posture to the mounting head 18. Although the target chip 100 is directly delivered from the PU device 14 to the mounting head 18 in FIG. 1, the target chip 100 may be delivered via other devices.

The energy irradiation device 16 is provided on the back surface side of the dicing tape 130, that is, on the opposite side of the PU device 14 with the dicing tape 130 interposed therebetween. The energy irradiation device 16 irradiates energy toward the target chip 100 in an area-selective manner to locally reduce the adhesive force of the dicing tape 130. The energy is selected according to the characteristics of the adhesive layer of the dicing tape 130. In this example, light, more specifically ultraviolet rays, is irradiated as the energy. In order to irradiate energy in an area-selective manner, the energy irradiation device 16 may change the position and/or posture of the energy generation source (for example, a UV lamp), or a mask member for limiting the irradiation area may be provided between the energy generation source and the dicing tape 130. In any case, the energy irradiation device 16 changes the irradiation position of the energy according to the position of the target chip 100. The reason for providing such an energy irradiation device 16 will be described later.

A controller 22 controls the driving of the mounting head 18, the PU device 14, and the energy irradiation device 16 described above. The controller 22 is physically a computer having a processor 50 and a memory 52.

As described above, the PU head 40 picks up the target chip 100 by holding the bonding surface 102 of the target chip 100, but at this time, if a part of the PU head 40 mechanically contacts the bonding surface 102, the bonding surface 102 may be mechanically or chemically changed, and the quality of the bonding surface 102 may deteriorate. This causes deterioration of the bonding quality between the chip 100 and the bonding target. In particular, as described above, when bonding is performed at room temperature, it is necessary to keep the quality of the bonding surface 102 high. Thus, it is required to prevent mechanical contact between the PU head 40 and the bonding surface 102.

Therefore, in this example, the PU head 40 is provided with a non-contact chuck 60 that holds the bonding surface 102 of the target chip 100 in a non-contact manner. Further, the energy irradiation device 16 is provided to reduce the adhesive force of the dicing tape 130 by irradiating the target chip 100 with energy. Hereinafter, the non-contact chuck 60 and the energy irradiation device 16 will be described in detail.

Figure 2:
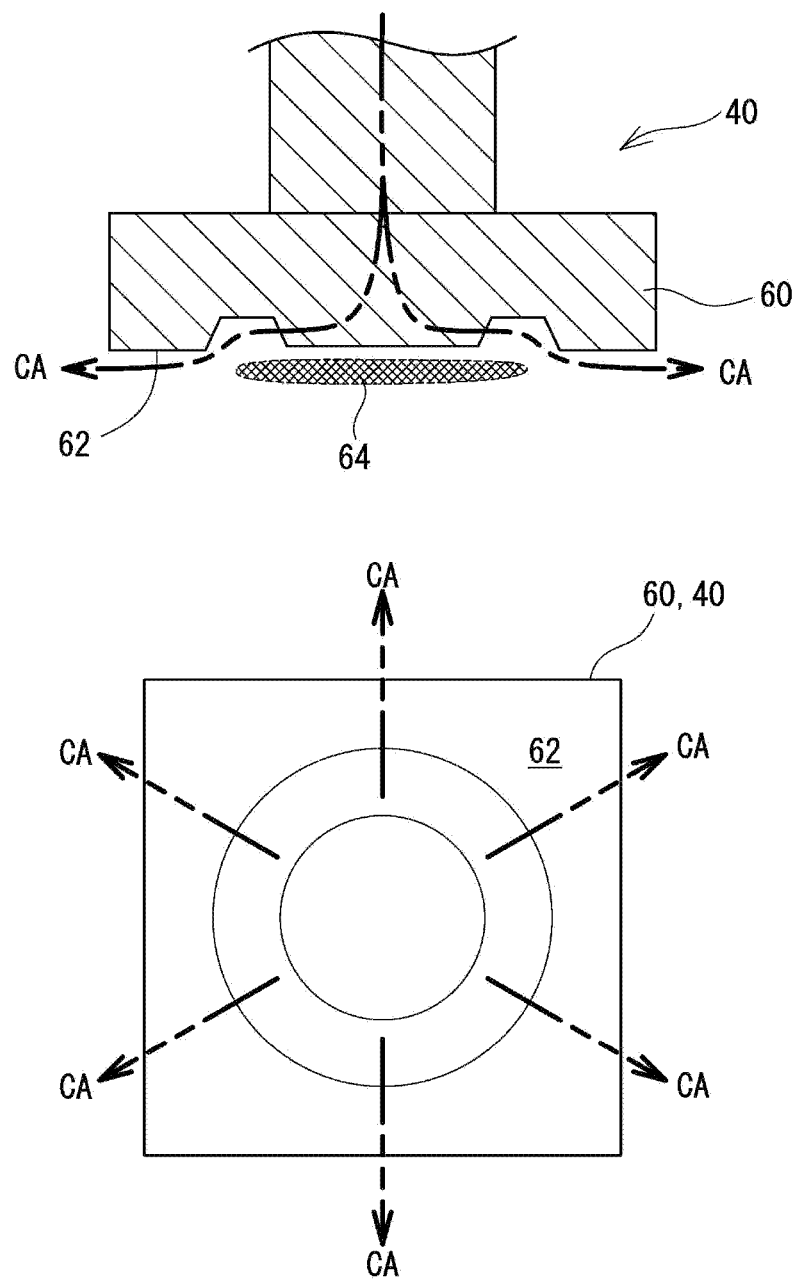
FIG. 2 is a schematic diagram showing a configuration of the PU head.

FIG. 2 is a schematic diagram showing a configuration of the PU head 40. As described above, the PU head 40 of this example has the non-contact chuck 60 that holds the bonding surface 102 of the target chip 100 in a non-contact manner. The non-contact chuck 60 is formed with a plurality of ejection holes (not shown) for ejecting compressed air CA from substantially the center of the bottom surface (that is, suction surface 62) thereof toward the outside in the surface direction. The compressed air CA flows radially or like a cyclone along the suction surface 62 from the ejection holes, so that a vacuum 64 is formed in substantially the center of the suction surface 62. With this vacuum 64 formed, the suction surface 62 is brought close to the bonding surface 102 until the distance to the bonding surface 102 becomes equal to or smaller than a predetermined suction distance, so that the target chip 100 is attracted to the suction surface 62. On the other hand, an air layer formed by the compressed air CA flowing outward in the surface direction is formed between the bonding surface 102 and the suction surface 62. This air layer excludes the bonding surface 102 from coming into contact with the suction surface 62. That is, the suction force generated by the formation of the vacuum 64 and the exclusion force generated by the air layer are simultaneously generated on the lower side of the suction surface 62, and as a result, the non-contact chuck 60 can hold the target chip 100 in a non-contact manner via the air layer.

By holding the target chip 100 with the non-contact chuck 60 in this way, damage to the bonding surface 102 can be reliably prevented. However, the suction force of the non-contact chuck 60 is very small. Therefore, for the non-contact chuck 60, it is difficult to peel off the target chip 100 from the dicing tape 130 against the adhesive force of the dicing tape 130.

Figure 3:
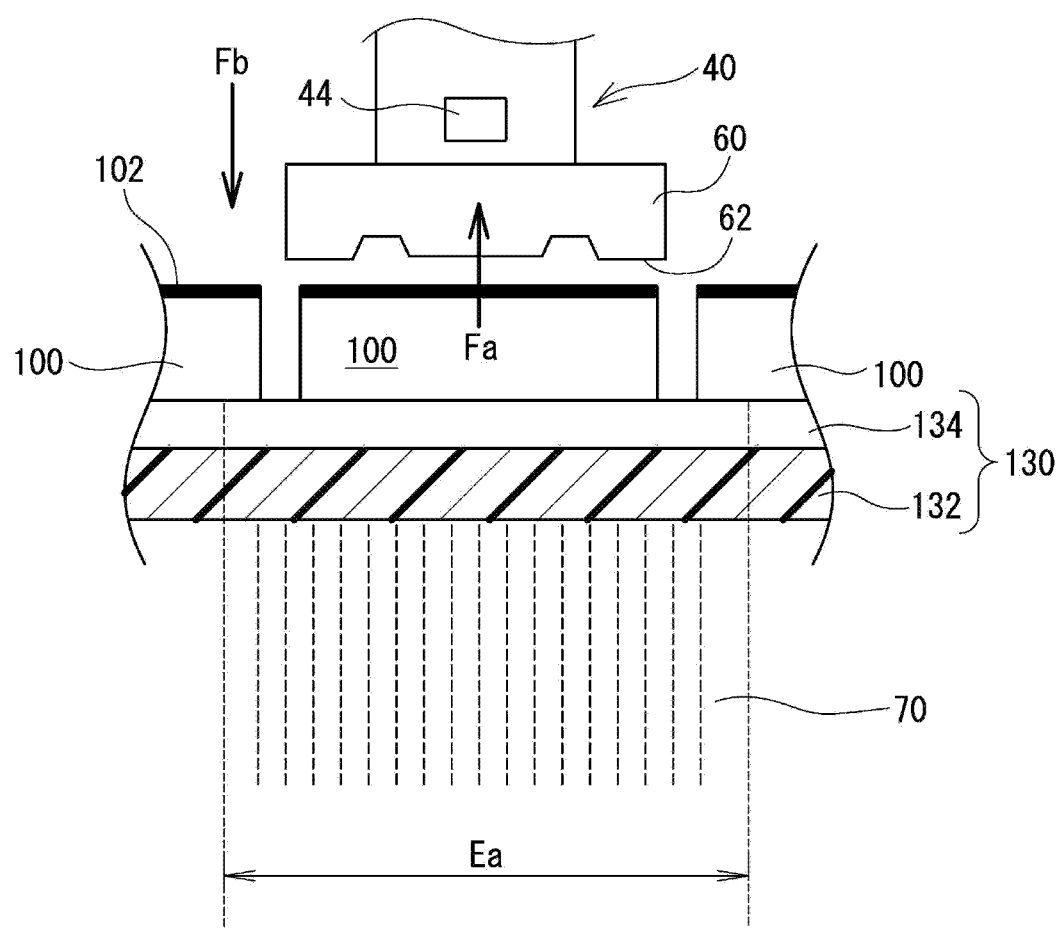
FIG. 3 is an image diagram showing a state of pickup performed by the PU head.
Figure 4:
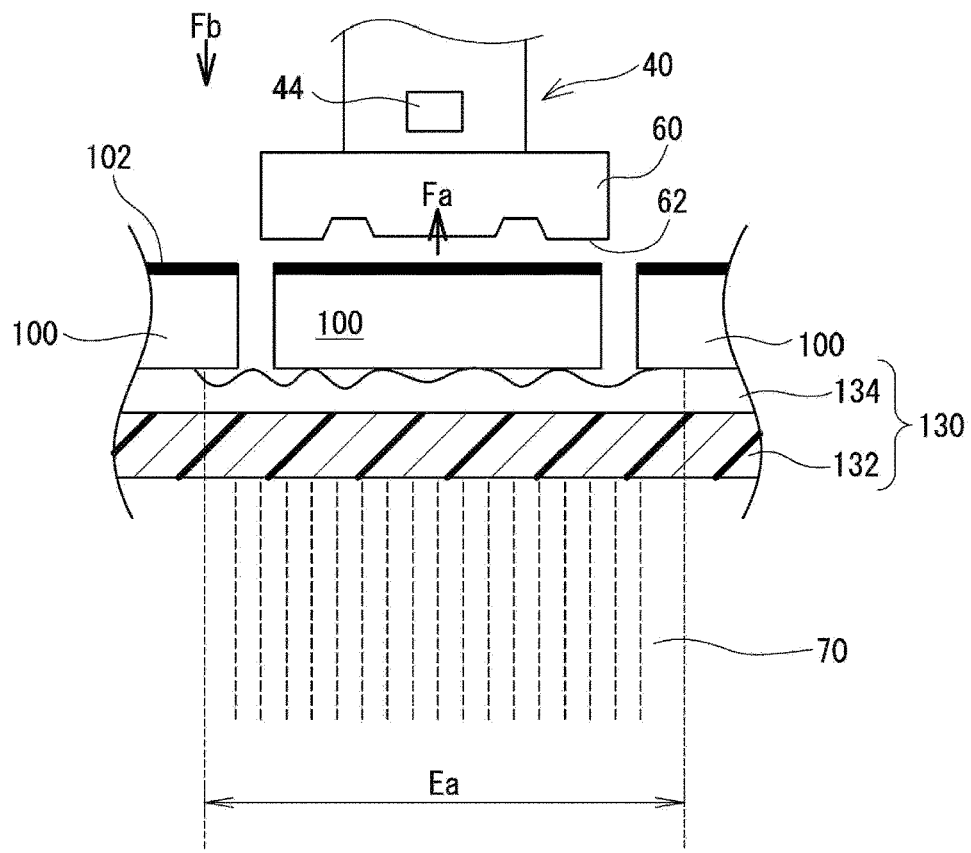
FIG. 4 is an image diagram showing a state of pickup performed by the PU head.
Figure 5:
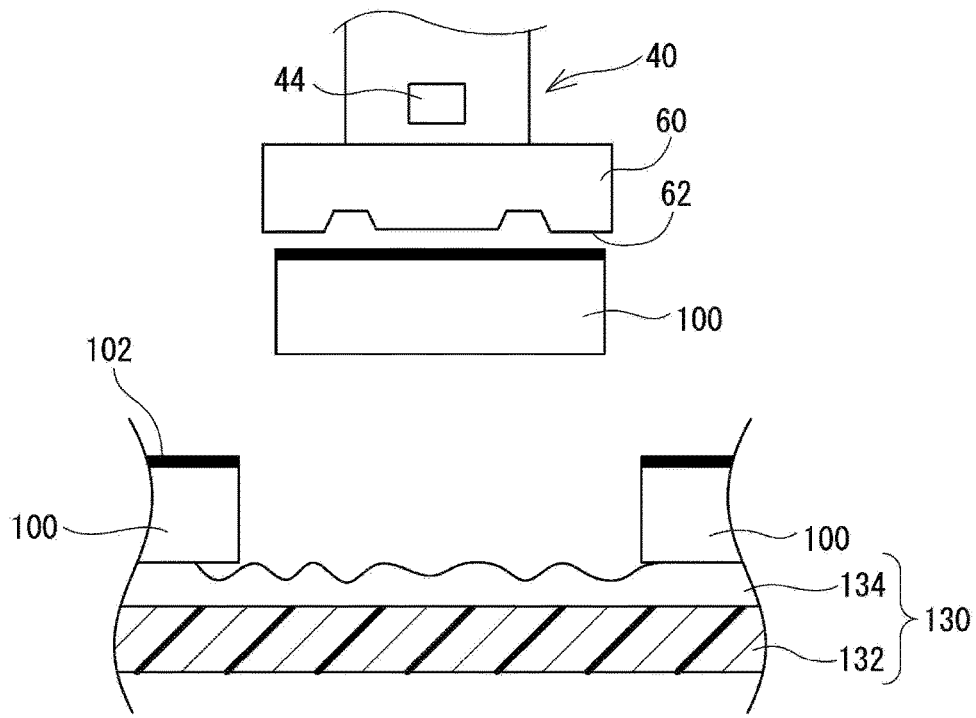
FIG. 5 is an image diagram showing a state of pickup performed by the PU head.

Thus, in this example, the energy irradiation device 16 is provided in order to locally reduce the adhesive force of the dicing tape 130. Here, the dicing tape 130 handled in this example will be described. FIG. 3 to FIG. 5 are image diagrams showing the states of pickup performed by the PU head 40.

As shown in FIG. 3 to FIG. 5, the dicing tape 130 is formed by laminating the base material 132 and the adhesive layer 134. The adhesive layer 134 is a UV self-peeling adhesive layer that loses the adhesive force due to irradiation of energy, more specifically ultraviolet rays, for the target chip 100 to be automatically peeled off. The UV self-peeling adhesive layer can be composed of, for example, a special acrylic polymer and a UV functional gas generating agent. When the UV self-peeling adhesive layer is irradiated with ultraviolet rays, nitrogen gas is generated in the adhesive, and the gas is released to the outside of the adhesive and the interface of the adhesive surface, and the gas accumulates at the interface of the adhesive, so that the adhered target is naturally peeled off. The base material 132 may be capable of transmitting ultraviolet rays and may be composed of, for example, a sheet made of transparent resin such as polyacrylic acid, polyolefin, polycarbonate, vinyl chloride, ABS, polyethylene terephthalate (PET), nylon, polyurethane, polyimide. Further, as other forms, the base material 132 may be composed of a sheet having a mesh-like structure, a sheet having holes, or the like.

When the area of the dicing tape 130 corresponding to the target chip 100 is irradiated with ultraviolet rays 70 by the energy irradiation device 16, as shown in FIG. 4, the adhesive force of the area is reduced, gas is generated from the adhesive layer 134 in the area, and the target chip 100 is automatically peeled off. Then, as the target chip 100 is peeled off from the dicing tape 130, the target chip 100 can be picked up even with the small suction force of the non-contact chuck 60. Finally, as shown in FIG. 5, the non-contact chuck 60 holds and lifts the target chip 100 in a non-contact manner with the air layer interposed between the non-contact chuck 60 and the target chip 100.

As is clear from the above description, according to this example, by irradiating the adhesive layer 134 with energy to locally reduce the adhesive force, the target chip 100 can be picked up using the non-contact chuck 60. Then, as a result, the quality deterioration of the bonding surface 102 can be effectively prevented, and the bonding quality between the target chip 100 and the bonding target can be further improved.

The irradiation of the ultraviolet rays 70 performed by the energy irradiation device 16 starts at the same time as or after the non-contact chuck 60 starts ejecting the compressed air CA at a position close to the target chip 100. This is to prevent the target chip 100 from jumping due to the gas generated from the UV self-peeling adhesive layer. That is, as described above, the adhesive layer 134 of the dicing tape 130 of this example is a UV self-peeling adhesive layer, and the UV self-peeling adhesive layer generates gas due to irradiation with the ultraviolet rays 70. Due to the ejection of this gas, the target chip 100 may jump from the dicing tape 130. In this example, the air ejection of the non-contact chuck 60 is started before the irradiation of the ultraviolet rays 70, in other words, before the generation of gas, so that the jumping of the target chip 100 can be suppressed by the force of the compressed air CA. As a result, the target chip 100 can be picked up in an appropriate posture.

In addition, the irradiation area Ea of the ultraviolet rays 70 (that is, energy) is an area that expands slightly outward with respect to the outer shape of the target chip 100 so as to completely cover the target chip 100. By making the irradiation area Ea larger than the target chip 100, even if there is a slight error in the positioning of the irradiation area Ea, the entire surface of the target chip 100 can be reliably irradiated. Then, by reliably reducing the adhesive force of the entire surface of the target chip 100, the target chip 100 can be reliably sucked even with the non-contact chuck 60 having a small suction force. In the case of the conventional contact type chuck, the irradiation area Ea needs to be slightly smaller than the outer shape of the target chip 100 so as not to accidentally suck the other adjacent chips 100. However, as repeatedly described above, since the non-contact chuck 60 used in this example has a small suction force, even if the adhesive force of some other chips 100 is reduced, the other chips 100 are not accidentally sucked. Therefore, there is no problem even if the irradiation area Ea is set to be larger than the target chip 100.

The PU device 14 raises the PU head 40 when the target chip 100 is peeled off from the dicing tape 130 due to the irradiation of the ultraviolet rays 70. The timing at which the target chip 100 is peeled off, and thus the timing at which the PU head 40 is raised, may be determined by the time that has elapsed from the start of the irradiation of the ultraviolet rays 70, or may be determined from the change of the load acting on the PU head 40. For example, the time required from the start of the irradiation of the ultraviolet rays 70 to the peeling is acquired in advance as a peeling time by an experiment, and in the actual pickup process, it may be determined that the target chip 100 has been peeled off at the timing when the peeling time has elapsed from the start of the irradiation of the ultraviolet rays 70.

Furthermore, as another form, the PU head 40 may be provided with a detector 44 for detecting the load acting on the PU head 40, and the timing of peeling may be determined based on the change of the load detected by the detector 44. That is, when the non-contact chuck 60 is brought close to the target chip 100 with the compressed air CA ejected, a vertical upward suction force Fa is generated on the target chip 100 (see FIG. 3 and FIG. 4). When the target chip 100 is adhesively held by the adhesive layer 134, a vertical downward reaction force Fb that opposes the suction force Fa acts on the PU head 40. This reaction force Fb drops sharply at the timing when the target chip 100 is peeled off from the adhesive layer 134. Therefore, the reaction force Fb, and thus the downward force acting on the PU head 40, may be detected by the detector 44, and the timing at which the detected load suddenly drops may be determined as the timing of peeling. The detector 44 may have a load sensor that detects the load acting on the PU head 40. Besides, as another form, the detector 44 may be a mechanism that detects the downward force acting on the PU head 40 by monitoring the output of a torque feedback motor that drives the PU head 40.

Figure 6:
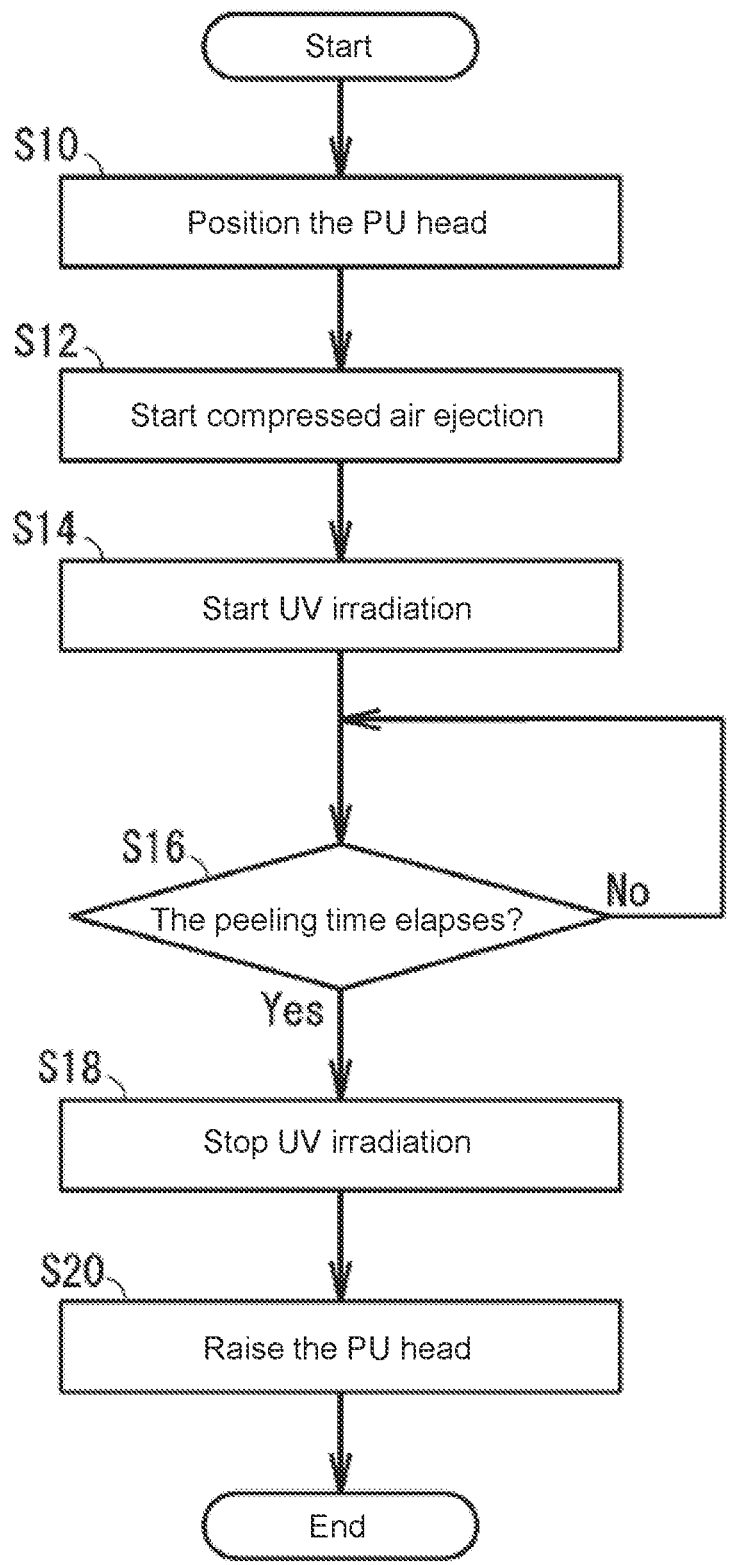
FIG. 6 is a flowchart showing a flow of the pickup process.

Next, a flow of the process of picking up the target chip 100 will be described. FIG. 6 is a flowchart showing the flow of the pickup process. When picking up the target chip 100, the controller 22 first positions the PU head 40 (S10). That is, the PU head 40 is horizontally moved directly above the target chip 100, and the PU head 40 is lowered to bring the PU head 40 close to the target chip 100 up to the distance at which the suction force acts on the target chip 100, that is, a suction distance.

When the PU head 40 is close to the target chip 100, the controller 22 supplies the compressed air CA to the non-contact chuck 60 of the PU head 40, and ejects the compressed air CA from the suction surface 62 (S12). As a result, the vacuum 64 is formed on the lower side of the non-contact chuck 60, and the suction force acts on the target chip 100.

When the ejection of the compressed air CA is started, the controller 22 starts the irradiation of the ultraviolet rays 70 by the energy irradiation device 16 (S14). The energy irradiation device 16 irradiates the ultraviolet rays 70 only to the area corresponding to the target chip 100. The controller 22 continues the irradiation of the ultraviolet rays 70 from the irradiation of the ultraviolet rays 70 until a predetermined peeling time elapses. Then, when the peeling time elapses (Yes in S16), the controller 22 determines that the target chip 100 has been peeled off from the dicing tape 130. As described above, the timing of peeling may be grasped by the load acting on the PU head 40 instead of the elapsed time. In any case, if the target chip 100 can be peeled off, the controller 22 stops the irradiation of the ultraviolet rays 70 (S18) and then raises the PU head 40 (S20). Accordingly, the pickup of one target chip 100 is completed. After the pickup, the PU device 14 delivers the target chip 100 picked up to the mounting head 18 as required. Further, if a new chip 100 needs to be picked up, steps S10 to S20 are repeated again.

As is clear from the above description, according to this example, the PU device 14 can pick up the target chip 100 without contacting the bonding surface 102. Therefore, deterioration of the quality of the bonding surface 102 can be prevented, and the bonding quality between the target chip 100 and the bonding target can be further improved. Nevertheless, the configuration described so far is an example, and if it includes the PU device 14 that holds and picks up the target chip 100 in a non-contact manner and the energy irradiation device 16 that irradiates energy toward the target chip 100 in an area-selective manner to locally reduce the adhesive force of the dicing tape 130, other configurations may be changed as appropriate.

For example, in the description so far, the irradiation of the ultraviolet rays 70 is started after the compressed air CA is ejected. However, before the ejection of the compressed air CA, in other words, before the start of the suction of the target chip 100 performed by the PU device 14, a pre-irradiation process of irradiating an amount of energy at which a residual adhesive force remains may be executed. Then, after this pre-irradiation process, a main irradiation process of irradiating an amount of energy at which the remaining adhesive force disappears may be executed.

In this case, the pre-irradiation process may be collectively performed in advance on all of the plurality of chips 100 on the dicing tape 130. Besides, as another form, the PU device 14 may perform the pre-irradiation process on a single chip 100 planned to be picked up next in processes other than the suction of the chip 100, for example, during the period of performing the process of transporting the chip 100 to the mounting head 18. As described above, by performing the pre-irradiation process in advance, the energy irradiation time in the main irradiation process can be shortened, and the time required for pickup can be shortened.

Further, in the description so far, light, more specifically ultraviolet rays, is irradiated as the energy for eliminating the adhesive force, but other types of energy, for example heat, may be irradiated. That is, depending on the type of the dicing tape 130, the adhesive force may be eliminated by heat instead of ultraviolet rays. For example, there is a dicing tape 130 which uses a thermosetting adhesive that is cross-linked by heating to improve the elastic modulus and thus reduce the adhesiveness, or a heat-foaming adhesive containing a foaming agent that foams by heating as the adhesive constituting the adhesive layer 134. When the chip 100 is held by such a dicing tape 130, the energy irradiation device 16 may irradiate heat as energy.

When the compressed air CA is ejected from the non-contact chuck 60, wind is generated around the target chip 100, so the temperature of the target chip 100 and the dicing tape 130 around the target chip 100 tends to decrease. Therefore, if the compressed air CA is ejected in parallel with heat irradiation, the temperature of the peeling layer may not rise sufficiently, and the peeling of the target chip 100 may be insufficient. Thus, when heat is irradiated as energy, the compressed air CA may be ejected from the non-contact chuck 60 after the peeling of the target chip 100 is completed, in other words, after the heat irradiation is completed.

Figure 7:
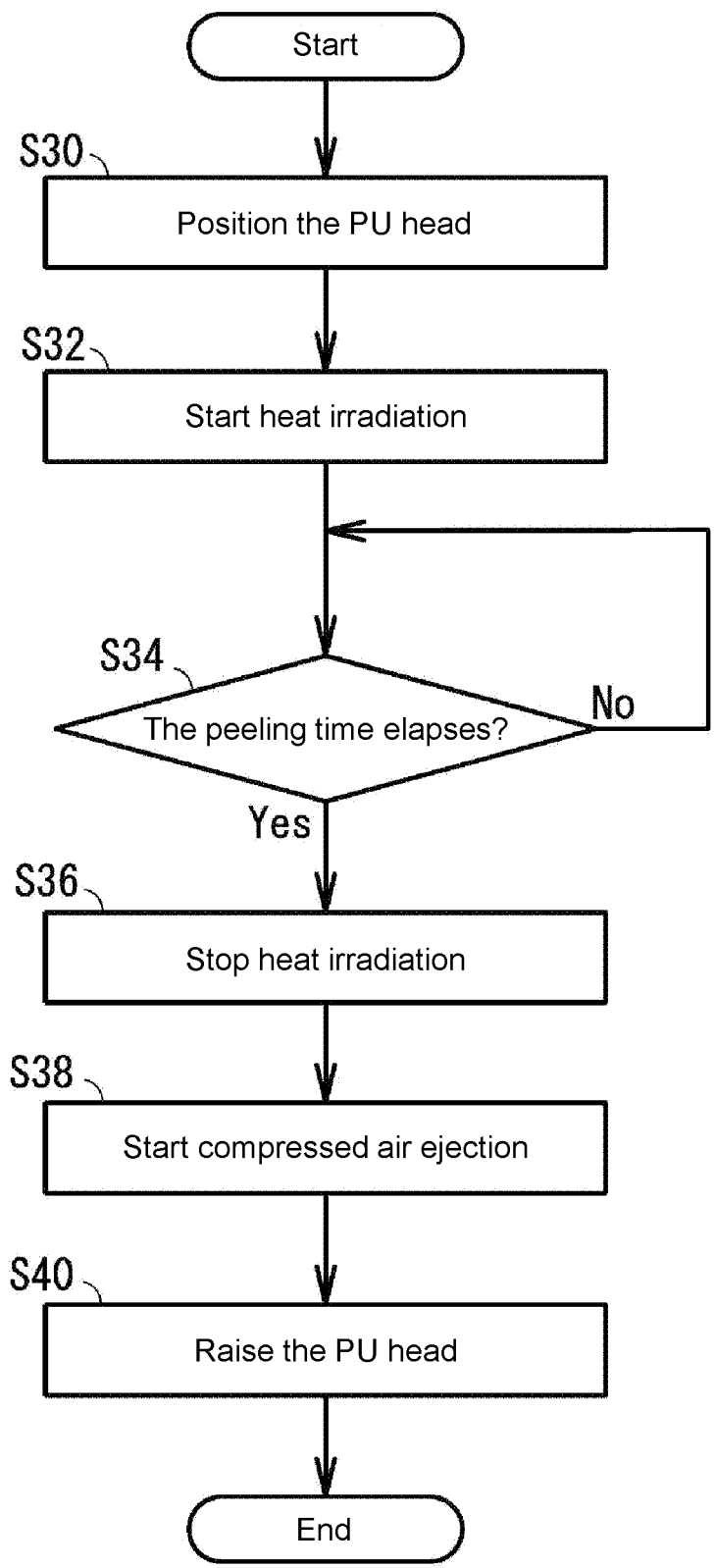
FIG. 7 is a flowchart showing another flow of the pickup process.

FIG. 7 is a flowchart showing a flow of the pickup process when heat is irradiated. As shown in FIG. 7, when a thermal self-peeling type dicing tape 130 is used, after the PU head 40 is positioned (S30), heat irradiation is started (S32) prior to the ejection of the compressed air CA (S38). Then, when it can be determined that the predetermined peeling time has elapsed (Yes in S34) and the peeling of the target chip 100 is completed, the ejection of the compressed air CA is started (S38), and the target chip 100 is held by the PU head 40 in a non-contact manner.

Figure 8:
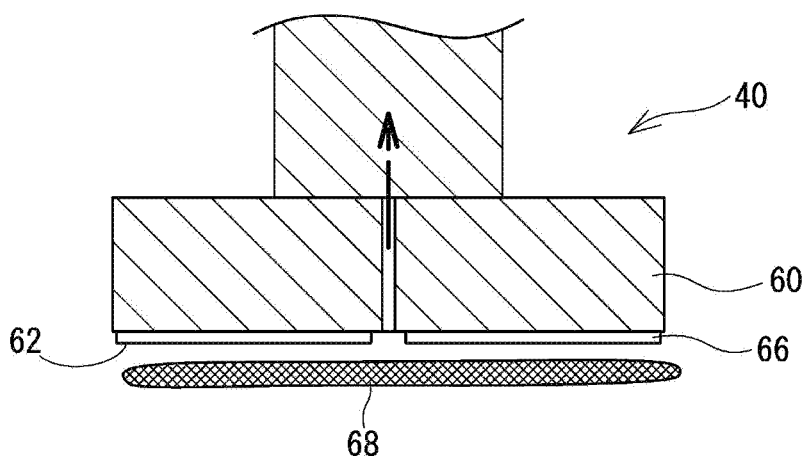
FIG. 8 is a diagram showing a configuration of the ultrasonic type non-contact chuck.

In addition, in the description so far, the air ejection type non-contact chuck 60 that holds the suction target in a non-contact manner by ejecting compressed air CA is used, but another form of non-contact chuck 60 may be used. For example, an ultrasonic type non-contact chuck 60 that holds the suction target in a non-contact manner by using high frequency vibration may be used. FIG. 8 is a diagram showing a configuration of the ultrasonic type non-contact chuck 60. The non-contact chuck 60 has a sonotrode 66 that vibrates slightly at a high frequency with application of a voltage. Due to this slight vibration, a compressed thin air film, so-called squeeze film 68, is formed on the lower surface of the non-contact chuck 60. The squeeze film 68 excludes contact of the target chip 100 with the suction surface 62. The non-contact chuck 60 also performs air suction in parallel with the formation of the squeeze film 68. As a result, the target chip 100 is sucked by the suction surface 62 while the squeeze film 68 hinders the contact with the suction surface 62. Therefore, the non-contact chuck 60 can hold the target chip 100 in a non-contact manner.

For both the air ejection type and the ultrasonic type, the non-contact chuck 60 restrains the suction target (target chip 100) in the axial direction thereof, but does not restrain the suction target in the direction of the suction surface 62. Therefore, the target chip 100 sucked by the non-contact chuck 60 is relatively easy to move in the surface direction of the suction surface 62.

Figure 9:
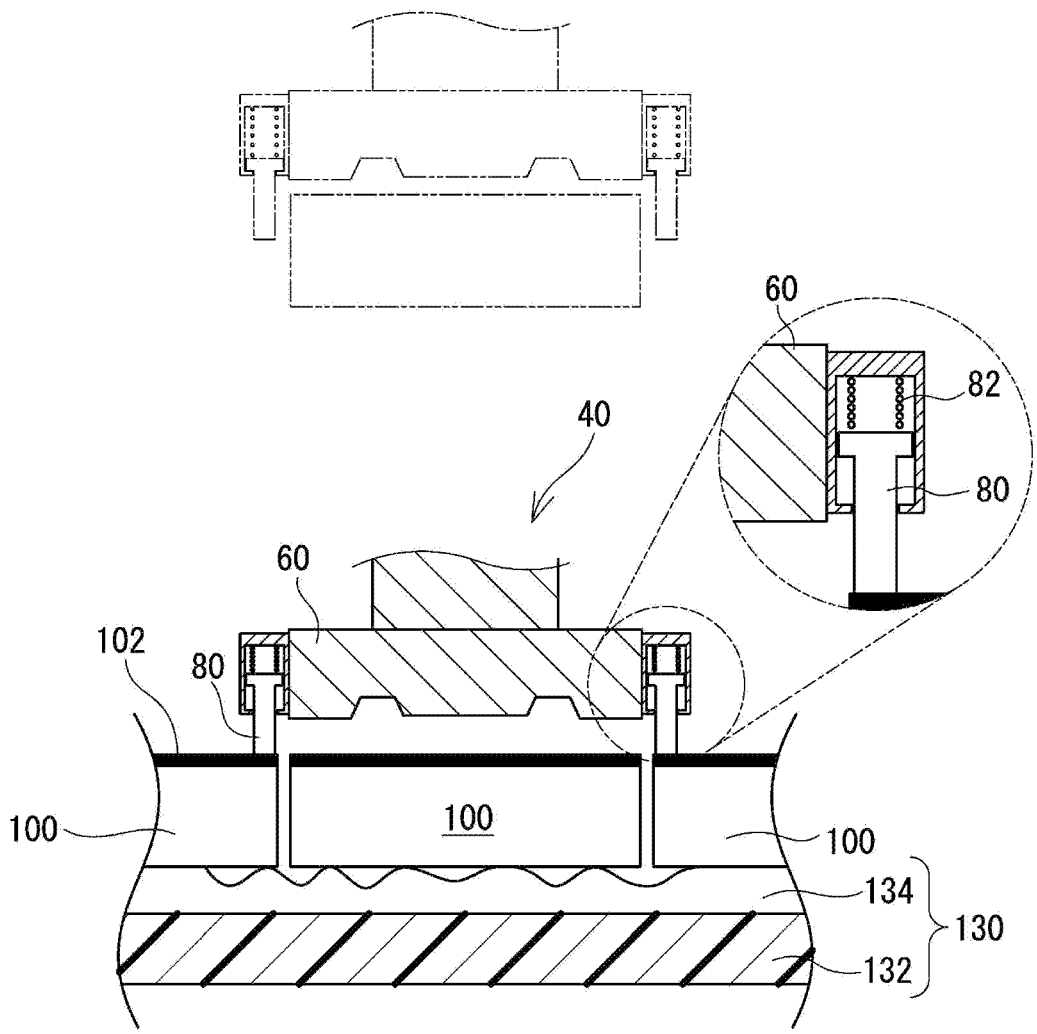
FIG. 9 is a diagram showing an example of the regulatory mechanism.

Thus, in order to suppress such movement of the target chip 100 in the surface direction, the PU head 40 may be provided with a regulatory mechanism for restricting the movement of the target chip 100 in the surface direction. FIG. 9 is a diagram showing an example of the regulatory mechanism. In FIG. 9, a regulation pin 80 capable of advancing and retracting in the axial direction is provided on the peripheral surface of the PU head 40. The regulation pin 80 is urged downward by a spring 82. When the non-contact chuck 60 is close to the target chip 100 on the dicing tape 130, the regulation pin 80 comes into contact with the bonding surface 102 of another chip 100 adjacent to the target chip 100. At this time, the regulation pin 80 retracts upward against the urging force of the spring 82 due to the reaction force received from another chip 100. In contrast, when the PU head 40 lifts the target chip 100, the regulation pin 80 advances downward due to the urging force of the spring. At this time, the lower end of the regulation pin 80 is lower than the upper surface (bonding surface 102) of the target chip 100, and the regulation pin 80 is close to the peripheral surface of the target chip 100. Therefore, even if the target chip 100 is to move in the surface direction, the target chip 100 comes into contact with the regulation pin 80, and the movement of the target chip 100 in the surface direction is restricted.

As is clear from the above description, the regulation pin 80 comes into contact with the bonding surface 102 of another target chip 100. The position of the regulation pin 80 is determined so that the contact does not deteriorate the bonding quality of the chip 100 to the bonding target. That is, the bonding material (for example, electrode part) to be bonded to the bonding target, in the bonding surface 102, is required to maintain high quality, but the area without the bonding material does not adversely affect the bonding quality even if the quality is slightly changed. Therefore, when the regulation pin 80 is provided, the position and size thereof may be determined so that the regulation pin 80 contacts a portion that does not affect the bonding quality.

Next, another embodiment will be described. The configuration of the manufacturing apparatus 10 of the present embodiment is substantially the same as that of the apparatus 10 shown in FIG. 1. The manufacturing apparatus 10 of the present embodiment has special control during a period from bringing the PU head 40 close to the target chip 100 to taking off (hereinafter referred to as "takeoff preparation period") in order to pick up the target chip 100.

Figure 10:
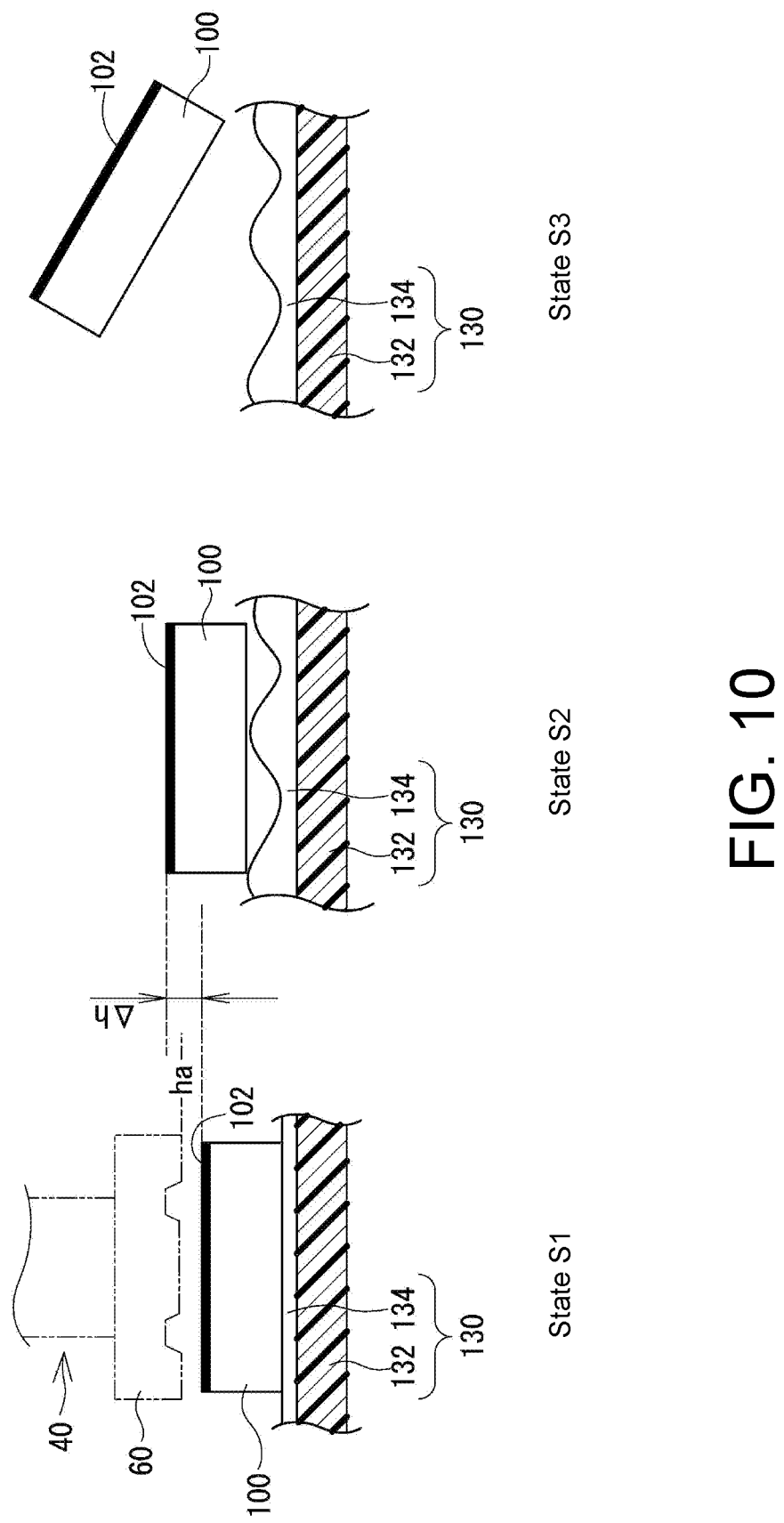
FIG. 10 is an image diagram showing a behavior of the target chip with energy irradiation.

Further, the dicing tape 130 used in the present embodiment floats the target chip 100 with the irradiation of energy (for example, ultraviolet rays or heat). This will be described with reference to FIG. 10. As described above and as shown in FIG. 10, the dicing tape 130 has the base material 132 and the adhesive layer 134. The state S1 of FIG. 10 shows an initial state before irradiating the dicing tape 130 with energy. In the initial state S1, the adhesive layer 134 adhesively holds the target chip 100.

The adhesive layer 134 generates gas or expands with the irradiation of energy. Due to such generation of gas and expansion, the target chip 100 is naturally peeled off from the adhesive layer 134. Further, due to the generation of gas and expansion, the target chip 100 floats upward as shown in the state S2 of FIG. 10. Therefore, if the height position of the PU head 40 is fixed at a height position that is excessively close to the target chip 100 in the initial state S1 (for example, the height ha in FIG. 10), there is a risk that the target chip 100 that has floated due to the energy irradiation and the PU head 40 may come into contact with each other. In contrast, if the PU head 40 is fixed at a position too far away from the target chip 100 in the initial state S1, the non-contact chuck 60 cannot hold the target chip 100. Therefore, due to the ejection force of the gas, the target chip 100 may jump up from the dicing tape 130 and scatter as shown in the state S3 of FIG. 10.

Thus, in the present embodiment, the position of the PU head 40 is controlled in consideration of the floating behavior of the target chip 100 due to the energy irradiation. Prior to the description of the position control of the PU head 40, the relationship between the distance between the suction surface 62 and the bonding surface 102 (hereinafter referred to as "inter-surface distance Df") and the force exerted by the non-contact chuck 60 on the target chip 100 will be described.

As described above, when the non-contact chuck 60 is the air ejection type, a layer of vacuum 64 (see FIG. 2) is formed on the lower side of the suction surface 62, and when the non-contact chuck 60 is the ultrasonic type, the squeeze film 68 (see FIG. 8) is formed on the lower side of the suction surface 62. The layer of vacuum 64 and the squeeze film 68 are both an air layer 72 having an adsorption force and a repulsive force. If the inter-surface distance Df is smaller than a predetermined maximum effective distance Dv, the force of the air layer 72 acts on the target chip 100.

Figure 11:
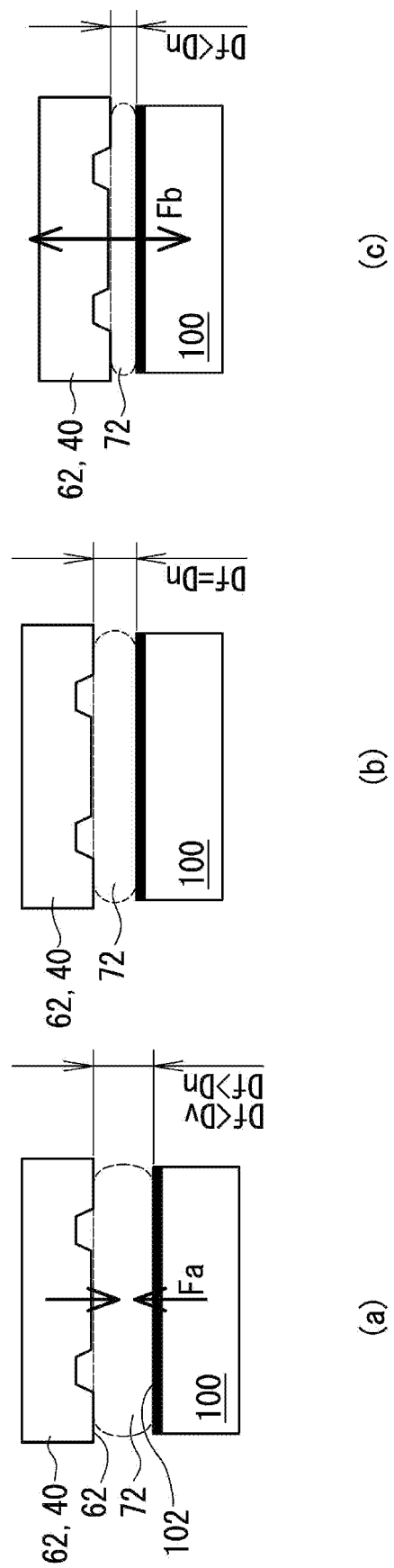
FIG. 11 is a diagram illustrating the relationship between the force that the air layer exerts on the target chip and the inter-surface distance.

To be more specific, as shown in (a) of FIG. 11, when the inter-surface distance Df is smaller than the maximum effective distance Dv and larger than a predetermined neutral distance Dn, the air layer 72 tends to reduce while attracting the target chip 100 so as to be close to Df=Dn. That is, in this case, the force Fa of attracting the target chip 100 toward the suction surface 62 acts on the target chip 100.

In contrast, as shown in (c) of FIG. 11, when the inter-surface distance Df is smaller than the neutral distance Dn, the air layer 72 tends to expand so as to be close to Df=Dn. At this time, when the target chip 100 is supported by the dicing tape 130, the target chip 100 is pressed by the air layer 72, and a reaction force corresponding to the pressing force Fb acts on the PU head 40.

Next, the position control of the PU head 40 in the present embodiment will be described. As described above, in the present embodiment, the position of the PU head 40 is controlled in consideration of the floating behavior of the target chip 100 due to the energy irradiation.

To be specific, during the pickup process, the PU head 40 is brought close to the target chip 100, and the target chip 100 is irradiated with energy. Then, when the target chip 100 is separated from the dicing tape 130, the PU head 40 is raised to take off the target chip 100 from the dicing tape 130.

Figure 12:
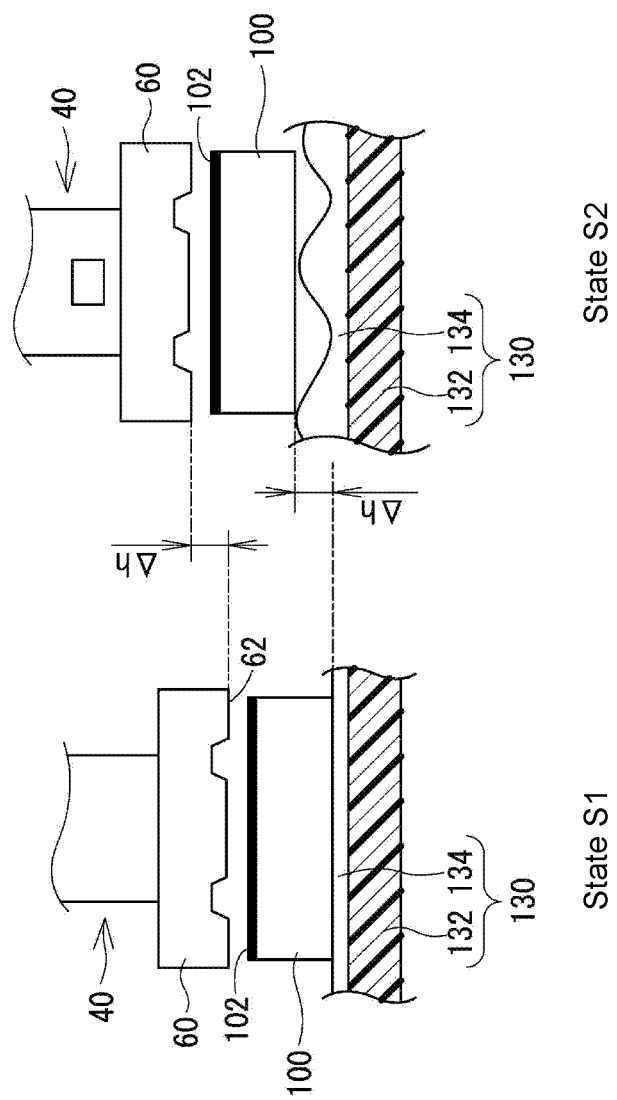
FIG. 12 is an image diagram showing a state of position control of the PU head during the takeoff preparation period.

In the present embodiment, during the takeoff preparation period, the PU head 40 is raised to offset the floating of the target chip 100 in order to prevent contact between the target chip 100 and the PU head 40. Further, at this time, the inter-surface distance Df is kept constant at a value smaller than the neutral distance Dn so that the pressing force acts on the target chip 100. FIG. 12 is an image diagram showing a state of this position control. As shown in FIG. 12, in the present embodiment, when the target chip 100 floats by the distance Δh between the initial state S1 and the state S2, the PU head 40 is also raised by the distance Δh to keep the inter-surface distance Df constant.

Here, in the present embodiment, in order to keep the inter-surface distance Df constant, the load acting on the PU head 40 is detected, and load-position control is performed on the PU head 40 so that this load is constant. By keeping the load constant, the thickness of the air layer 72, and thus the inter-surface distance Df, are kept constant. The load acting on the PU head 40 is estimated from the current (hereinafter referred to as "drive current") applied to the motor that moves the PU head 40 in the Z direction. Further, as another form, a dedicated load sensor may be mounted on the PU head 40. In any case, the controller 22 raises the PU head 40 if the load acting on the PU head 40 is larger than the target value during the takeoff preparation period, and lowers the PU head 40 if the load is smaller than the target value.

Figure 13:
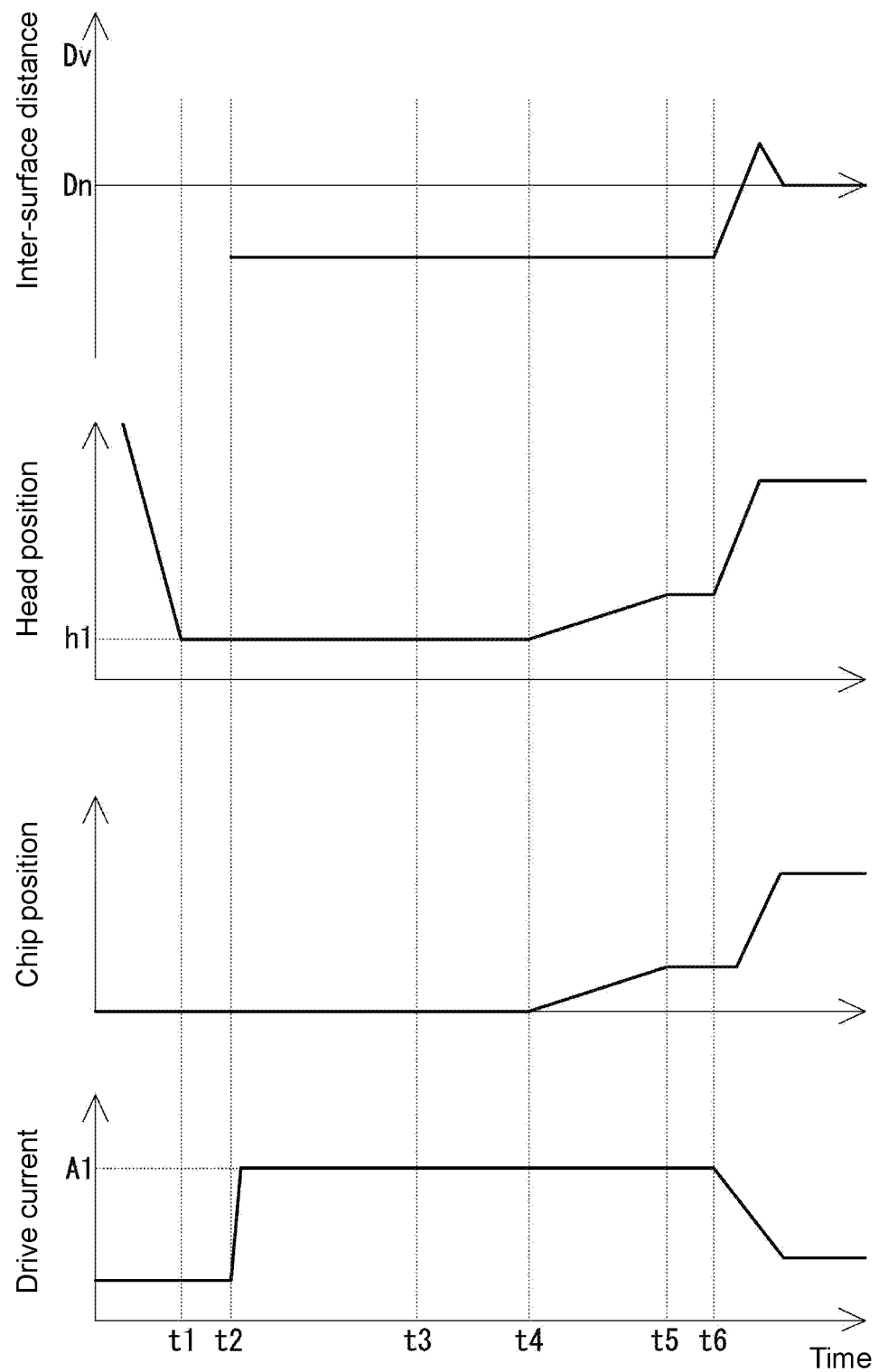
FIG. 13 is an example of the timing chart in the pickup process.

FIG. 13 is an example of a timing chart in the pickup process. In FIG. 13, the first stage represents the inter-surface distance Df, and when the inter-surface distance Df is smaller than the neutral distance Dn, a pressing force acts on the target chip 100, and when the inter-surface distance Df is larger than the neutral distance Dn, a pulling force acts on the target chip 100. Further, the second stage in FIG. 13 indicates the Z-direction position of the PU head 40, and the third stage indicates the Z-direction position of the target chip 100. In addition, the fourth stage in FIG. 13 indicates the drive current applied to the motor that drives the PU head 40. This drive current is proportional to the load acting on the PU head 40. Further, in FIG. 13, the PU head 40 has the air ejection type non-contact chuck 60, and the energy irradiation device 16 irradiates the ultraviolet rays 70 as energy.

When picking up the target chip 100, the controller 22 lowers the PU head 40 to a predetermined target height h1. In this case, the target height h1 is a value at which the inter-surface distance Df is larger than zero and smaller than the neutral distance Dn. The target height h1 is specified in advance by carrying out an experiment or simulation. In FIG. 12, at time t1, the PU head 40 has reached the target height h1.

At time t2 after the PU head 40 reaches the target height h1, the controller 22 starts the air ejection of the non-contact chuck 60. As a result, the air layer 72 is formed on the lower side of the suction surface 62, and the force of the air layer 72 generates a predetermined pressing force on the chip 100. Further, a reaction force corresponding to the pressing force is generated in the PU head 40. As a result, the load acting on the PU head 40, and thus the drive current, rises sharply. The controller 22 performs load-position control on the PU head 40 so that the drive current maintains a predetermined target current A1. Here, the target current A1 is a value corresponding to the pressing force. The target current A1 is obtained in advance by an experiment or simulation.

Subsequently, the controller 22 drives the energy irradiation device 16 at time t3 and starts irradiating the target chip 100 with the ultraviolet rays 70. Thus, gas is generated from the adhesive layer 134 that adhesively holds the target chip 100, and the adhesive layer 134 expands. As a result, after time t4, the target chip 100 gradually floats.

When the target chip 100 floats and the inter-surface distance Df becomes small, the pressing force, and thus the drive current, rise. When the drive current rises, the controller 22 raises the PU head 40 until the drive current reaches the target current A1. By continuing such processing, the PU head 40 rises following the floating of the target chip 100, and the inter-surface distance Df is kept substantially constant. As a result, even if the target chip 100 floats, contact between the target chip 100 and the PU head 40 can be reliably prevented.

At time t6 when the target chip 100 is completely peeled off from the dicing tape 130, the controller 22 raises the PU head 40 to take off the target chip 100. The timing at which the target chip 100 is completely peeled off, in other words, the timing at which the takeoff is executed, may be determined from the floating amount of the target chip 100 (and thus the PU head 40) or may be determined by the time that has elapsed from the start of energy irradiation.

As is clear from the above description, by driving and controlling the PU head 40 to keep the load constant, even if the target chip 100 floats, the inter-surface distance Df can be kept constant, and contact between the PU head 40 and the target chip 100 can be prevented. Further, in the present embodiment, since the inter-surface distance Df is kept less than the neutral distance Dn, the target chip 100 can be pressed by the air layer 72 until immediately before the takeoff, and the target chip 100 can be effectively prevented from scattering due to the ejection of gas.

Next, another embodiment will be described. In the above example, in order to keep the inter-surface distance Df constant, the position of the PU head 40 is controlled so that the load is constant. In the present embodiment, a target profile showing a time change of the target position of the PU head 40 for keeping the inter-surface distance Df constant in the takeoff preparation period is stored in advance. Then, during the takeoff preparation period, the position of the PU head 40 is controlled according to this target profile.

That is, an experiment or simulation is performed in advance to obtain the time change of the Z-direction position of the target chip 100 after the energy irradiation. Based on the time change of the Z-direction position of the target chip 100, the time change of the target position of the PU head 40 that can keep the inter-surface distance Df constant is obtained as the target profile and stored in the memory 52. That is, a time-position curve of the PU head 40 as shown in the second stage of FIG. 13 is stored in the memory 52 in advance.

When the irradiation of energy is started, the controller 22 controls the position of the PU head 40 according to the target profile stored in the memory 52. That is, at each sampling timing of the control, the actual position of the PU head 40 and the target position are compared, and the PU head 40 is raised or lowered to bring the actual position close to the target position. With such a configuration, even if the target chip 100 floats, the inter-surface distance Df can be kept constant, and contact between the PU head 40 and the target chip 100 can be prevented.

Figure 14:
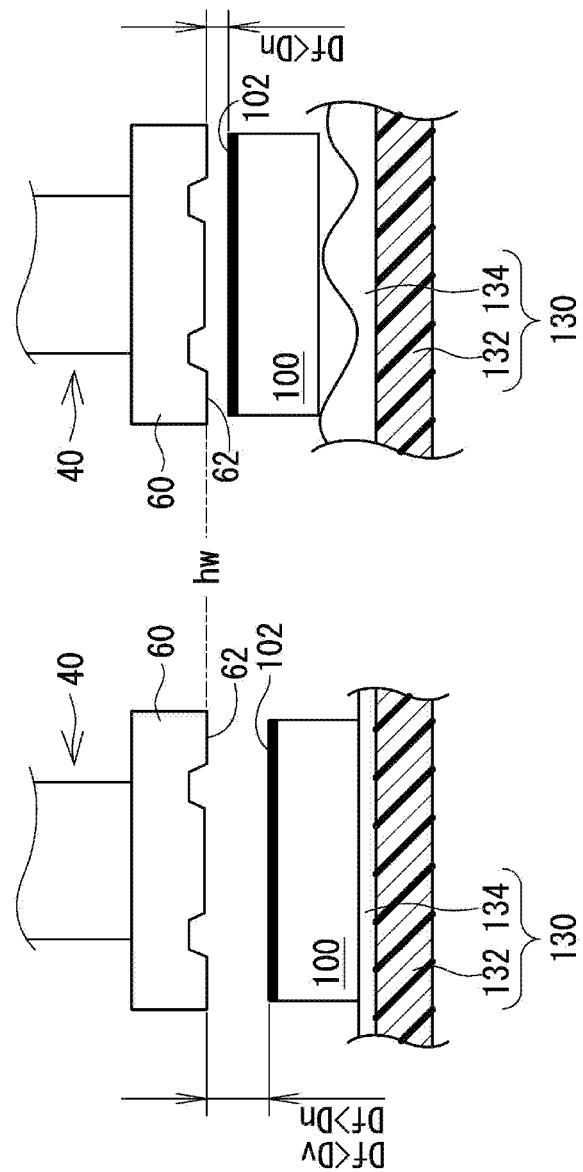
FIG. 14 is an image diagram showing a state of another example of position control of the PU head during the takeoff preparation period.

Next, another embodiment will be described. FIG. 14 is an image diagram showing the state of another embodiment. As shown in FIG. 14, in the present embodiment, the PU head 40 is set to stand by at a predetermined standby height hw during the takeoff preparation period. The standby height hw is a height at which the target chip 100 can be held without the PU head 40 coming into contact with the target chip 100 when the target chip 100 completely floats.

Further, in the present embodiment, the standby height hw is set to a height at which the inter-surface distance Df becomes smaller than the maximum effective distance Dv at the timing before the target chip 100 starts to float. With such a configuration, the force of the air layer 72 can act on the target chip 100 during the takeoff preparation period, so the target chip 100 can be effectively prevented from scattering.

Furthermore, in the present embodiment, the standby height hw is set to a height at which the inter-surface distance Df becomes larger than the neutral distance Dn at the timing before the target chip 100 starts to float. With such a configuration, a relatively large inter-surface distance Df can be secured in the stage before the floating starts, so even if the target chip 100 floats, contact between the PU head 40 and the target chip 100 can be more reliably prevented. Such a standby height hw is specified by carrying out an experiment or simulation in advance.

Figure 15:
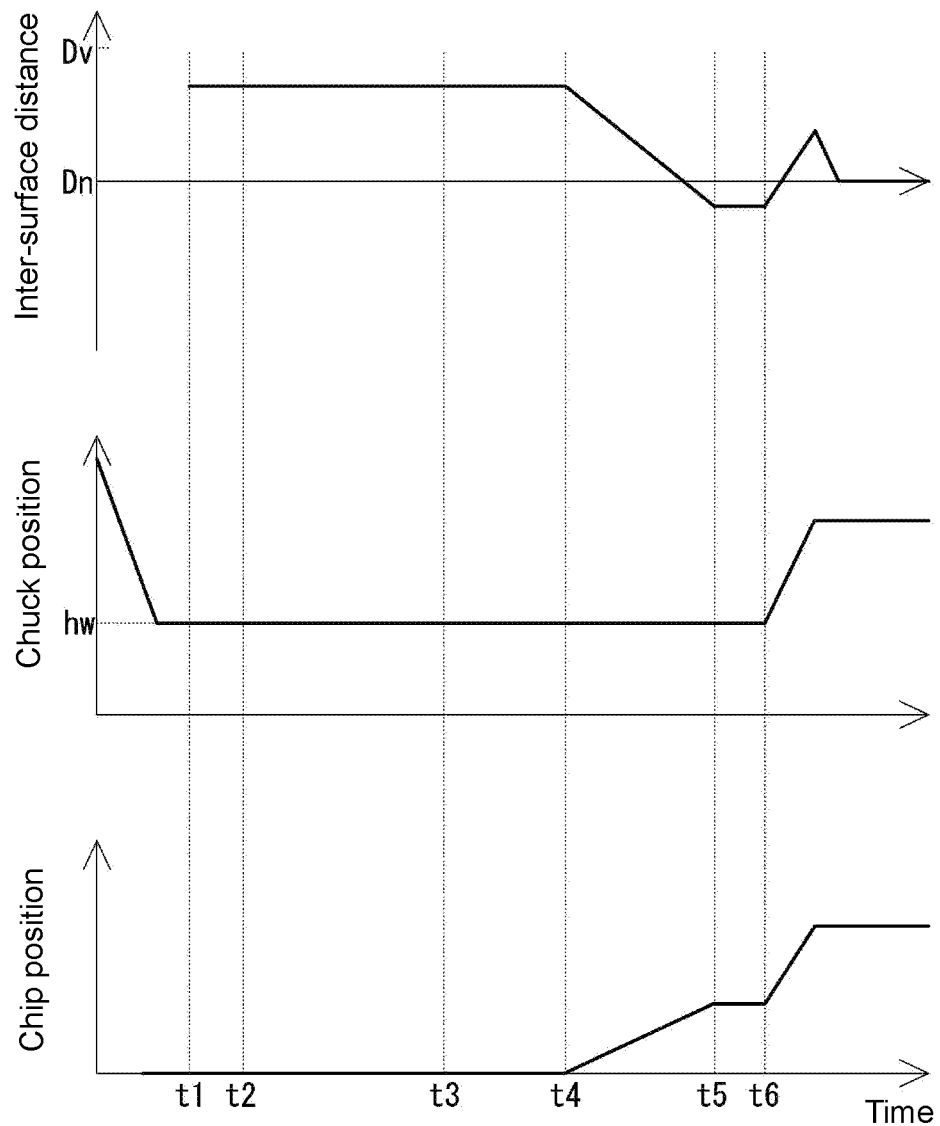
FIG. 15 is another example of the timing chart in the pickup process.

FIG. 15 is an example of a timing chart in the pickup process in the present embodiment. In FIG. 15, the first stage represents the inter-surface distance Df. Further, the second stage in FIG. 15 indicates the Z-direction position of the non-contact chuck 60, and the third stage indicates the Z-direction position of the target chip 100.

When picking up the target chip 100, the controller 22 lowers the PU head 40 to a predetermined standby height hw. In FIG. 15, at time t1, the PU head 40 has reached the standby height hw. As a result, the inter-surface distance Df is less than the maximum effective distance Dv and exceeds the neutral distance Dn.

Subsequently, the controller 22 starts the air ejection of the non-contact chuck 60 at time t2. As a result, the air layer 72 is formed on the lower side of the suction surface 62. At this point, since Dn<Df<Dv, a pulling force of a predetermined strength is generated on the target chip 100. However, since the target chip 100 is attached to the dicing tape 130 at this point, even if the target chip 100 receives the pulling force, the Z-direction position of the target chip 100 does not change.

Thereafter, the controller 22 drives the energy irradiation device 16 at time t3 and starts irradiating the target chip 100 with the ultraviolet rays 70. Thus, gas is generated from the adhesive layer 134 that adhesively holds the target chip 100, and the adhesive layer 134 expands. As a result, after time t4, the target chip 100 gradually floats.

As the target chip 100 floats, the inter-surface distance Df sharply decreases. Then, at the point of time t5 when the target chip 100 is completely peeled off, the inter-surface distance Df becomes less than the neutral distance Dn on the target chip 100, and a pressing force acts on the target chip 100. If the target chip 100 can be completely peeled off, at time t6, the controller 22 raises the PU head 40 to take off the target chip 100.

As is clear from the above description, according to the present embodiment, the PU head 40 is on standby at the standby height hw during the takeoff preparation period. Therefore, even when the target chip 100 floats, it is possible to prevent the PU head 40 from coming into contact with the target chip 100. Further, the standby height hw is set to a value at which the inter-surface distance Df becomes smaller than the maximum effective distance Dv in the stage before the target chip 100 starts to float. Therefore, the force of the air layer 72 can act on the target chip 100 during the takeoff preparation period. As a result, the target chip 100 is constantly held by the non-contact chuck 60, so even if gas is suddenly ejected from the adhesive layer 134, the target chip 100 is prevented from scattering.

Nevertheless, the configuration described so far is an example, and other configurations may be changed as long as the position of the PU head 40 is controlled to prevent the target chip 100 and the PU head 40 from coming into contact with each other even if the target chip 100 floats during the takeoff preparation period. For example, in the embodiments of FIG. 13 and FIG. 15, the air ejection type non-contact chuck 60 is adopted, and the dicing tape 130 that self-peels by irradiation of the ultraviolet rays 70 is adopted. However, the non-contact chuck 60 may be an ultrasonic type, and the dicing tape 130 may self-peel by irradiation of heat.

REFERENCE SIGNS LIST 10 manufacturing apparatus, 12 wafer holding device, 14 PU device, 16 energy irradiation device, 18 mounting head, 20 stage, 22 controller, 30 expanding ring, 32 ring retainer, 40 PU head, 44 detector, 50 processor, 52 memory, 60 non-contact chuck, 62 suction surface, 64 vacuum, 66 sonotrode, 68 squeeze film, 70 ultraviolet ray, 80 regulation pin, 82 spring, 100 chip, 102 bonding surface, 110 substrate, 130 dicing tape, 132 base material, 134 adhesive layer, 136 wafer ring.

What is claimed is:

1. A manufacturing apparatus for manufacturing a semiconductor device by bonding one or more chips, which each has a bonding surface and a holding surface opposite to the bonding surface, to a bonding target, the manufacturing apparatus comprising:
    a wafer holding device holding the one or more chips with the holding surface adhesively held on a surface of a dicing tape together with the dicing tape, wherein the wafer holding device comprises a ring;
    a pickup device comprising a pickup head that holds a target chip, which is a chip to be picked up among the one or more chips, in a non-contact manner and picking up the target chip from the dicing tape;
    an energy irradiation device irradiating energy, which is light or heat, in an area-selective manner toward the target chip from a back surface side of the dicing tape to reduce an adhesive force of the dicing tape; and
    a controller controlling an operation of the pickup device and the energy irradiation device,
    wherein an adhesive layer of the dicing tape is a self-peeling adhesive layer having an adhesive force that decreases with irradiation of the energy and floats the target chip by a distance, and
    the controller controls a position of the pickup head so that the target chip and the pickup head do not come into contact with each other even if the target chip floats during a takeoff preparation period from bringing the pickup head close to the target chip for pickup to taking off the target chip from the dicing tape.

2. The manufacturing apparatus for manufacturing the semiconductor device according to claim 1, wherein the controller keeps an inter-surface distance, which is a distance between a suction surface of the pickup head and the bonding surface of the target chip, constant by raising the pickup head to offset floating of the target chip during the takeoff preparation period.

3. The manufacturing apparatus for manufacturing the semiconductor device according to claim 2, wherein the pickup head attracts the target chip to the suction surface when the inter-surface distance is smaller than a maximum effective distance and larger than a neutral distance, and presses the target chip in a direction away from the suction surface when the inter-surface distance is smaller than the neutral distance, and
    the controller keeps the inter-surface distance constant at a distance smaller than the neutral distance during the takeoff preparation period.

4. The manufacturing apparatus for manufacturing the semiconductor device according to claim 3, wherein the controller performs position-load control on the pickup head to keep a load acting on the pickup device constant during the takeoff preparation period.

5. The manufacturing apparatus for manufacturing the semiconductor device according to claim 3, wherein the controller stores a target profile showing a time change of a target position of the pickup head for keeping the inter-surface distance constant during the takeoff preparation period, and controls the position of the pickup head according to the target profile in the takeoff preparation period.

6. The manufacturing apparatus for manufacturing the semiconductor device according to claim 3, wherein the pickup head ejects air from the suction surface or applies ultrasonic vibration to the suction surface to form an air layer between the pickup head and a suction target and hold the suction target in a non-contact manner, and the controller starts ejection of the air or application of the ultrasonic vibration at the same time as start of irradiation of the energy performed by the energy irradiation device or before start of irradiation.

7. The manufacturing apparatus for manufacturing the semiconductor device according to claim 2, wherein the controller performs position-load control on the pickup head to keep a load acting on the pickup device constant during the takeoff preparation period.

8. The manufacturing apparatus for manufacturing the semiconductor device according to claim 7, wherein the pickup head ejects air from the suction surface or applies ultrasonic vibration to the suction surface to form an air layer between the pickup head and a suction target and hold the suction target in a non-contact manner, and the controller starts ejection of the air or application of the ultrasonic vibration at the same time as start of irradiation of the energy performed by the energy irradiation device or before start of irradiation.

9. The manufacturing apparatus for manufacturing the semiconductor device according to claim 2, wherein the controller stores a target profile showing a time change of a target position of the pickup head for keeping the inter-surface distance constant during the takeoff preparation period, and controls the position of the pickup head according to the target profile in the takeoff preparation period.

10. The manufacturing apparatus for manufacturing the semiconductor device according to claim 9, wherein the pickup head ejects air from the suction surface or applies ultrasonic vibration to the suction surface to form an air layer between the pickup head and a suction target and hold the suction target in a non-contact manner, and the controller starts ejection of the air or application of the ultrasonic vibration at the same time as start of irradiation of the energy performed by the energy irradiation device or before start of irradiation.

11. The manufacturing apparatus for manufacturing the semiconductor device according to claim 2, wherein the pickup head ejects air from the suction surface or applies ultrasonic vibration to the suction surface to form an air layer between the pickup head and a suction target and hold the suction target in a non-contact manner, and the controller starts ejection of the air or application of the ultrasonic vibration at the same time as start of irradiation of the energy performed by the energy irradiation device or before start of irradiation.

12. The manufacturing apparatus for manufacturing the semiconductor device according to claim 1, wherein the controller causes the pickup head to stand by at a standby height during the takeoff preparation period, and the standby height is a height for holding the target chip without the pickup head coming into contact with the target chip when the target chip completely floats.

13. The manufacturing apparatus for manufacturing the semiconductor device according to claim 12, wherein the pickup head attracts the target chip to a suction surface when an inter-surface distance, which is a distance between the suction surface of the pickup head and the bonding surface of the target chip, is smaller than a maximum effective distance and larger than a neutral distance, and presses the target chip in a direction away from the suction surface when the inter-surface distance is smaller than the neutral distance, and the standby height is a height at which the inter-surface distance becomes smaller than the maximum effective distance and larger than the neutral distance at a timing before the target chip starts to float.

14. The manufacturing apparatus for manufacturing the semiconductor device according to claim 13, wherein the pickup head ejects air from the suction surface or applies ultrasonic vibration to the suction surface to form an air layer between the pickup head and a suction target and hold the suction target in a non-contact manner, and the controller starts ejection of the air or application of the ultrasonic vibration at the same time as start of irradiation of the energy performed by the energy irradiation device or before start of irradiation.

15. The manufacturing apparatus for manufacturing the semiconductor device according to claim 12, wherein the pickup head ejects air from the suction surface or applies ultrasonic vibration to the suction surface to form an air layer between the pickup head and a suction target and hold the suction target in a non-contact manner, and the controller starts ejection of the air or application of the ultrasonic vibration at the same time as start of irradiation of the energy performed by the energy irradiation device or before start of irradiation.

16. The manufacturing apparatus for manufacturing the semiconductor device according to claim 1, wherein the pickup head ejects air from the suction surface or applies ultrasonic vibration to the suction surface to form an air layer between the pickup head and a suction target and hold the suction target in a non-contact manner, and the controller starts ejection of the air or application of the ultrasonic vibration at the same time as start of irradiation of the energy performed by the energy irradiation device or before start of irradiation.

* * * * *